(12) United States Patent
Ishikawa et al.

(10) Patent No.: US 6,538,290 B1
(45) Date of Patent: Mar. 25, 2003

(54) STATIC PROTECTION DEVICE

(75) Inventors: Yasuhisa Ishikawa, Kanagawa (JP); Yukihiro Terada, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/492,072

(22) Filed: Jan. 27, 2000

(30) Foreign Application Priority Data

Jan. 28, 1999 (JP) .......................................... 11-020112

(51) Int. Cl.[7] ............................................... H01L 23/62
(52) U.S. Cl. .......................... 257/362; 257/355; 257/546
(58) Field of Search ................................ 257/355, 361, 257/362, 546; 361/100, 101

(56) References Cited

U.S. PATENT DOCUMENTS

| 4,543,593 A | * | 9/1985 | Fujita | 257/546 |
| 4,789,917 A | * | 12/1988 | Miller | 361/56 |
| 4,821,096 A | * | 4/1989 | Maloney | 327/427 |
| 5,138,413 A | * | 8/1992 | Grosset et al. | 257/355 |
| 5,237,198 A | * | 8/1993 | Lee | 257/557 |
| 5,304,839 A | * | 4/1994 | Chen et al. | 257/546 |
| 5,432,368 A | * | 7/1995 | Jimenez | 257/355 |
| 5,493,133 A | * | 2/1996 | Duvvury et al. | 257/111 |
| 5,821,797 A | * | 10/1998 | Kinugasa et al. | 327/318 |
| 5,889,309 A | * | 3/1999 | Yu et al. | 257/363 |
| 5,903,420 A | * | 5/1999 | Ham | 361/56 |
| 6,084,272 A | * | 7/2000 | Jung | 257/355 |
| 6,281,527 B1 | * | 8/2001 | Chen | 257/168 |

FOREIGN PATENT DOCUMENTS

| JP | 3-56-40272 | * | 4/1981 | 257/362 |
| JP | 3-59-61161 | * | 4/1984 | 257/362 |
| JP | 4-1-262655 | * | 10/1989 | 257/362 |
| JP | 4-3-69155 | * | 3/1991 | 257/362 |
| JP | 4-5-21714 | * | 6/1993 | 257/355 |
| JP | 4-08-274184 | * | 10/1996 | H01L/21/8234 |

* cited by examiner

*Primary Examiner*—George Eckert
(74) *Attorney, Agent, or Firm*—Whitham, Curtis & Christofferson, P.C.

(57) ABSTRACT

A static protection device protects an internal circuit of a semiconductor device from surge voltages. An emitter terminal of the PNP transistor is connected to the input/output terminal, a collector terminal of the PNP transistor is connected to the ground terminal, and the base terminal is left open, to realize the static protection device. In this manner the reverse-biased protection can be maintained with respect to the internal circuit.

8 Claims, 6 Drawing Sheets

STATIC PROTECTION DEVICE

BACKGROUND OF THE INVENTION

This invention relates to a static protection device for protecting an internal circuit of a semiconductor device from a surge voltage applied to an input/output terminal.

A static protection device of a semiconductor device in a related art is configured, for example, as shown in FIG. 7. That is, in FIG. 7, a static protection device 30 of a semiconductor device comprises a diode 33 connected between an input/output terminal (IN/OUT) 31 for signal input/output and a ground terminal (GND) 32 so that a PN junction becomes reverse-biased when the circuit is operated.

FIG. 8 shows a layout of the static protection device 30 as a plane pattern. A pad 34 is connected to the input/output terminal 31 via input/output wiring 35 made of aluminum (Al) wiring. The diode 33 consisting of an N-type region 37 and a P-type region 38 is formed between the input/output terminal 31 and the ground terminal 32. The N-type region 37 is connected to the input/output wiring 35 through a contact window 39. The P-type region 38 is connected to the ground terminal 32 by ground wiring.

FIG. 9 shows the cross section of the semiconductor device incorporating the static protection device 30. The semiconductor device comprises an N-type semiconductor layer 42 formed on a surface of a P-type silicon (Si) semiconductor substrate 41 by epitaxial growth and the parts shown in FIGS. 7 and 8 further formed on the N-type semiconductor layer 42. Isolation regions 40 for element separation are formed in the N-type semiconductor layer 42. An N$^+$-type buried layer 44 is formed between the P-type silicon semiconductor substrate 41 and the N-type semiconductor layer 42. Numeral 45 denotes a silicon oxide film. A PN-junction diode 33 is formed in an element region 36. That is, a P$^+$-type region 38 and an N$^+$-type region 37 are formed away from each other in a lateral direction on a surface of the N-type semiconductor layer 42. The PN junction between the P$^+$-type region 38 and the N$^+$-type region 37 forms the diode 33. The N-type region 37 is connected to input/output wiring 35 and the P-type region 38 is connected to ground wiring 43.

However, according to the specification of IC, there is possibility that the potential of the input/output terminal becomes below the ground potential. In such a case, the diode is regarded as a forward-biased diode and the breakdown voltage thereof becomes the forward direction threshold voltage of the PN junction. Namely, the reverse-biased protection cannot be assured with respect to the internal circuit of the IC.

Another static protection device of a semiconductor device in a related art configured as shown in FIG. 10 is also available. That is, in FIG. 10, a static protection device 50 of a semiconductor device comprises an NPN transistor 53 connected between an input/output terminal (IN/OUT) 51 for signal input/output and a ground terminal (GND) 52 so that a PN junction becomes reverse-biased at the circuit operation time.

FIG. 11 shows a plane layout of the static protection device 50. A pad 54 is connected to the input/output terminal 51 via input/output wiring 55 made of aluminum (Al) wiring. The NPN transistor 53 consisting of an N-type region 56, a P-type region 57, and an N-type region 58 is formed between the input/output terminal 51 and the ground terminal 52. The N-type region 56 is connected to the input/output wiring 55 through a contact window 59. A window 60 is opened in an isolation region in the vicinity of the NPN transistor 53 for connection to the ground terminal by ground wiring 61.

FIG. 12 shows the cross section of the semiconductor device incorporating the static protection device 50. The semiconductor device comprises an N-type semiconductor layer 63 formed on a surface of a P-type silicon (Si) semiconductor substrate 62 by epitaxial growth and the parts shown in FIGS. 10 and 11 further formed on the N-type semiconductor layer 63. Isolation regions 67 for element separation are formed in the N-type semiconductor layer 63. An N$^+$-type buried layer 66 is formed between the P-type silicon (Si) semiconductor substrate 62 and the N-type semiconductor layer 63. Numeral 64 denotes a silicon oxide film. An N-type region 56, an N-type region 58, and a P-type region 57 are formed on a surface of the N-type semiconductor layer 63. The N-type region 56, the N-type region 58, and the P-type region 57 form the NPN transistor 53. The N-type region 56 is connected to input/output wiring 55 and the N-type region 58 and the P-type region 67, 68 are connected to ground wiring 61.

The PN junction between the N-type region 56 and the P-type region 57 is equivalently regarded as the reverse-biased diode shown in FIG. 7. Therefore, if the NPN transistor 53 is provided for a static protection device for an IC wherein there is possibility that the potential of the input/output terminal becomes below the ground potential, the reverse-biased protection cannot be assured with respect to such IC according to the discussion described above.

SUMMARY OF THE INVENTION

It is therefore an object of the invention to provide a static protection device for preventing an IC operation problem from arising if an input/output terminal falls below ground (GND) potential.

In order to achieve the above object, in one of device regions of an integrated semiconductor device having an input/output terminal and a ground terminal, an emitter terminal of the PNP transistor is connected to the input/output terminal, and a collector terminal of the PNP transistor is connected to the ground terminal to realize a static protection device.

DETAILED DESCRIPTION OF THE PREFERRED EMBODIMENTS

Referring now to the accompanying drawings, preferred embodiments of the present invention will be described below in detail.

Figure 1:
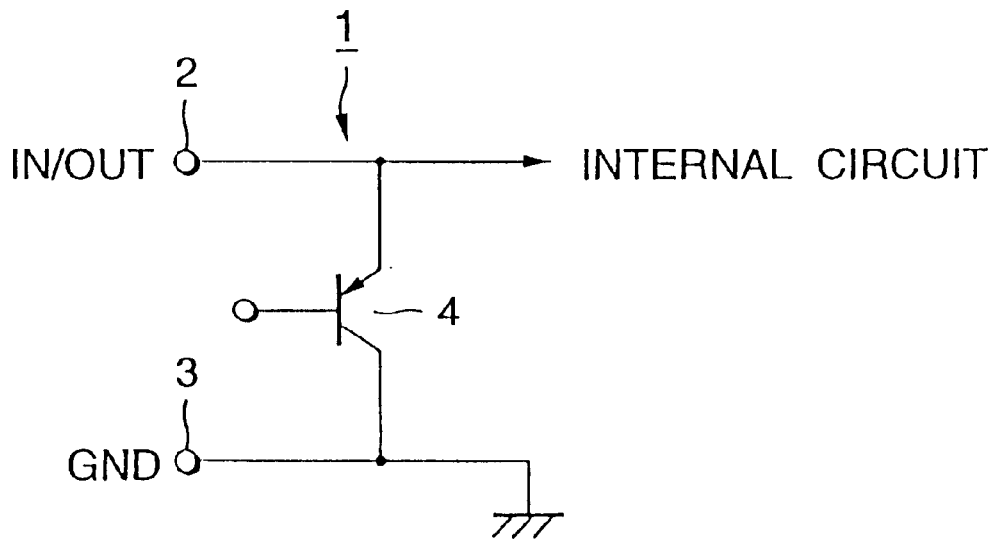
FIG. 1 is an equivalent circuit diagram of a static protection device according to a first embodiment of the present invention.

FIG. 1 shows a first embodiment of the invention. In FIG. 1, a static protection device 1 of a semiconductor device comprises a PNP transistor 4 connected between a signal input/output terminal 2 of an internal circuit of a semiconductor device (not shown) and a ground (GND) terminal 3. The PNP transistor 4 has an emitter terminal connected to the signal input/output terminal 2 and a collector terminal connected to the ground terminal 3.

Figure 2:
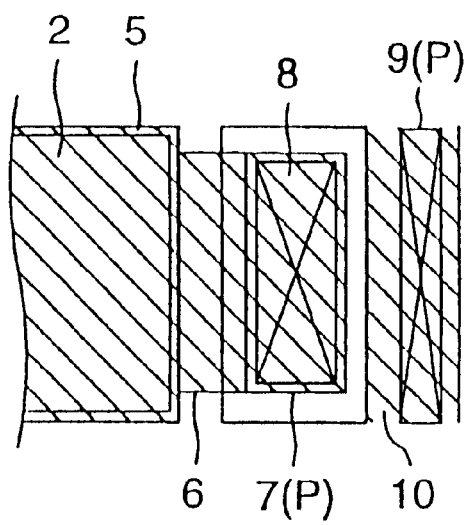
FIG. 2 is a plan view of the static protection device of FIG. 1.

FIG. 2 shows a plane layout of the static protection device 1. A pad 5 is connected to the input/output terminal 2 via input/output wiring 6 made of aluminum (Al) wiring. A P-type region 7 and a P-type region 9 to form the PNP transistor 4 are formed between the input/output terminal 2 and the ground terminal 3. The P-type region 7 is connected to the input/output wiring 6 through a contact window 8. The P-type region 9 is connected to ground wiring 10.

Figure 3:
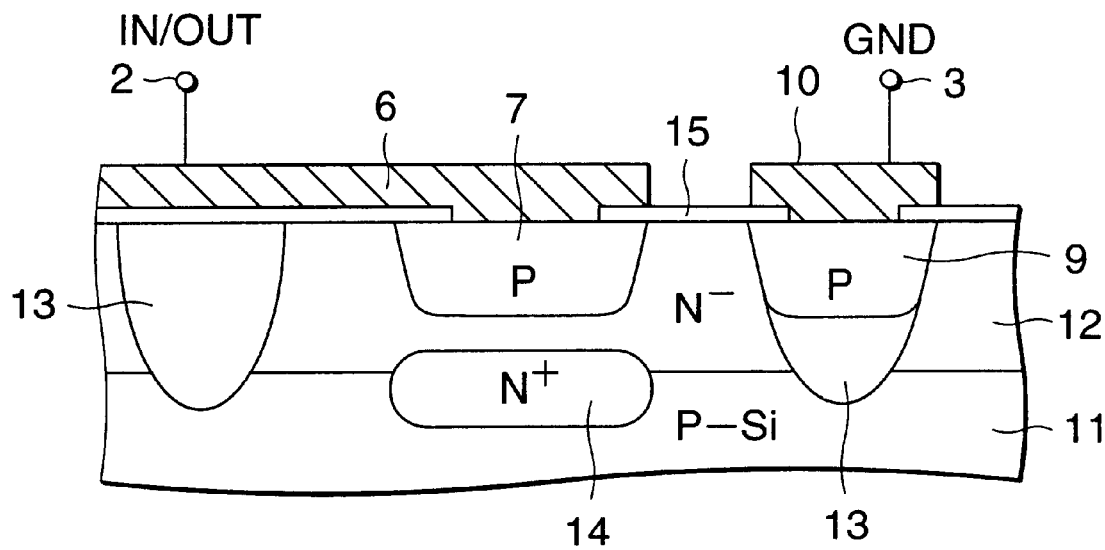
FIG. 3 is a sectional view of the static protection device of FIG. 1.

FIG. 3 shows the cross section of the semiconductor device incorporating the static protection device 1. The semiconductor device comprises an N-type semiconductor layer 12 formed on a surface of a P-type silicon (Si) semiconductor substrate 11 by epitaxial growth and the parts shown in FIGS. 1 and 2 further formed on the N-type semiconductor layer 12. Isolation regions 13 for element separation are formed in the N-type semiconductor layer 12. An N$^+$-type buried layer 14 is formed between the P-type Si semiconductor substrate 11 and the N-type semiconductor layer 12. Numeral 15 denotes an silicon oxide film. A P-type region 7 and a P-type region 9 are formed away from each other in a lateral direction on a surface of the N-type semiconductor layer 12. The P-type regions 7 and 9 and the N-type semiconductor layer 12 form the PNP transistor 4. The P-type region 7 is connected to input/output wiring 6 and the P-type region 9 is connected to ground wiring 10.

In the static protection device 1, the region of an emitter part of the P-type region 7 and the area of the contact window 8 can be made large. Even if the input/output terminal 2 falls below the GND potential, since the PN junction between the emitter and the collector (base is open) of the PNP transistor 4 is originally reverse-biased and the breakdown voltage thereof is sufficiently high, the reverse-biased protection can be maintained with respect to the internal circuit. While since the above withstand voltage is lower than the breakdown voltage of a conventional protection diode, energy applied to the junction part when a breakdown occurs can be suppressed to a small energy level.

Figure 4:
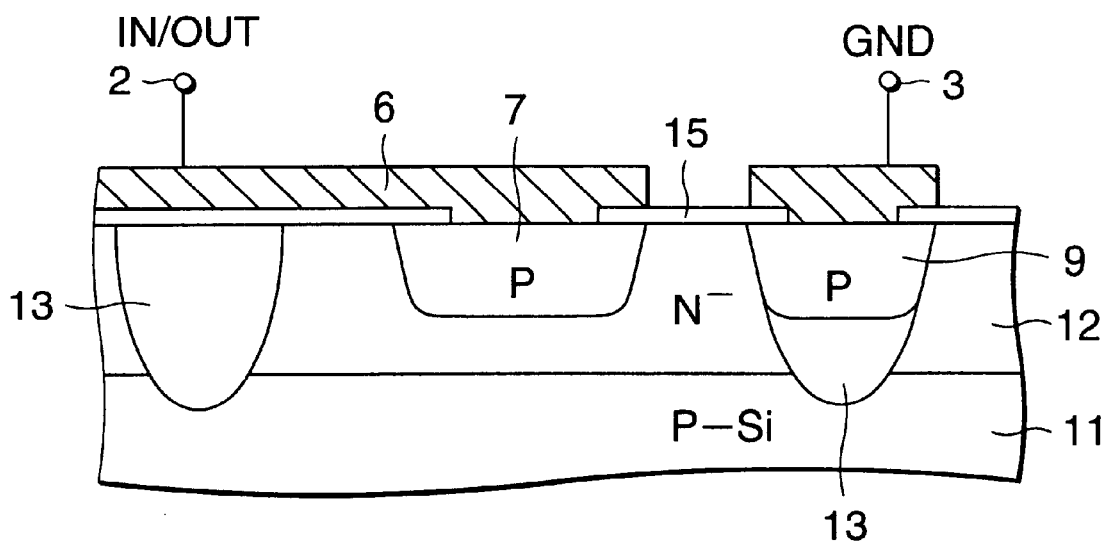
FIG. 4 is a sectional view of a static protection device according to a second embodiment of the present invention.

As a second embodiment of the present invention, the static protection device 1 may be formed as a part of a semiconductor device as shown in FIG. 4, wherein the N$^+$-type buried layer 14 previously described with reference to FIG. 3 is not provided.

Figure 5:
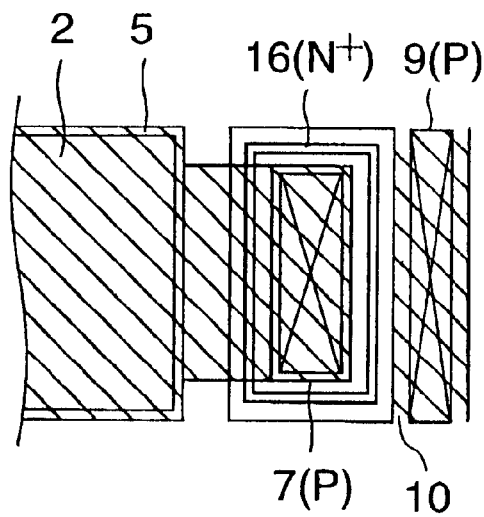
FIG. 5 is a plan view of a static protection device according to a third embodiment of the present invention.

Further, as a third embodiment of the static protection device, whose plane layout is shown in FIG. 5, is also possible. In the embodiment, an emitter part which becomes the P-type region 7 shown in FIG. 2 is surrounded by an N$^+$-type region 16. Thus, the conduction-type inversion into P-type occurring on the surface of an epitaxial layer can be prevented.

Figure 6:
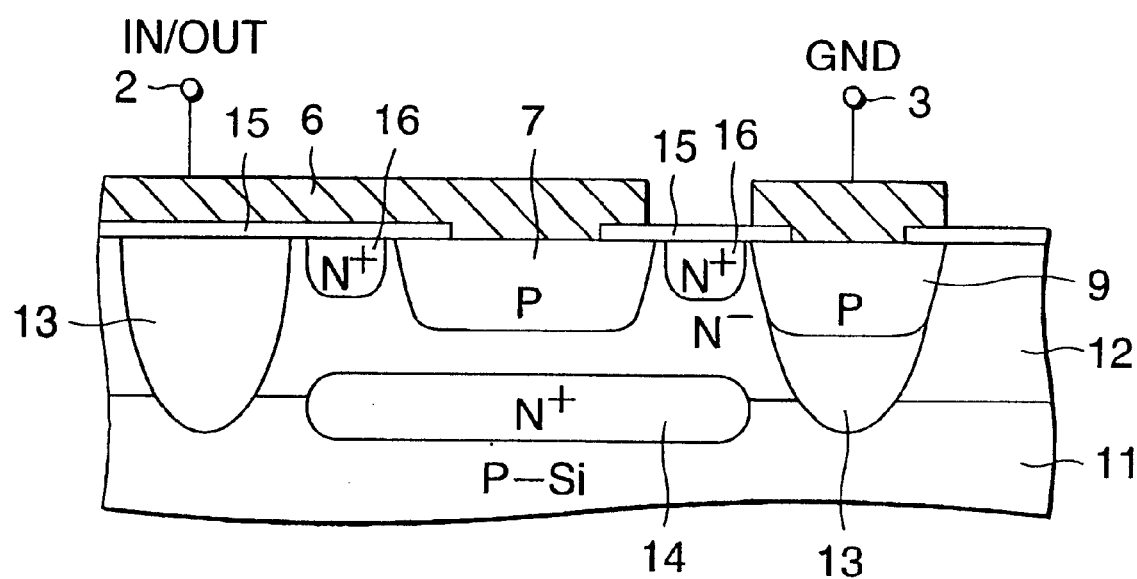
FIG. 6 is a sectional view of the static protection device of FIG. 5.
Figure 7:
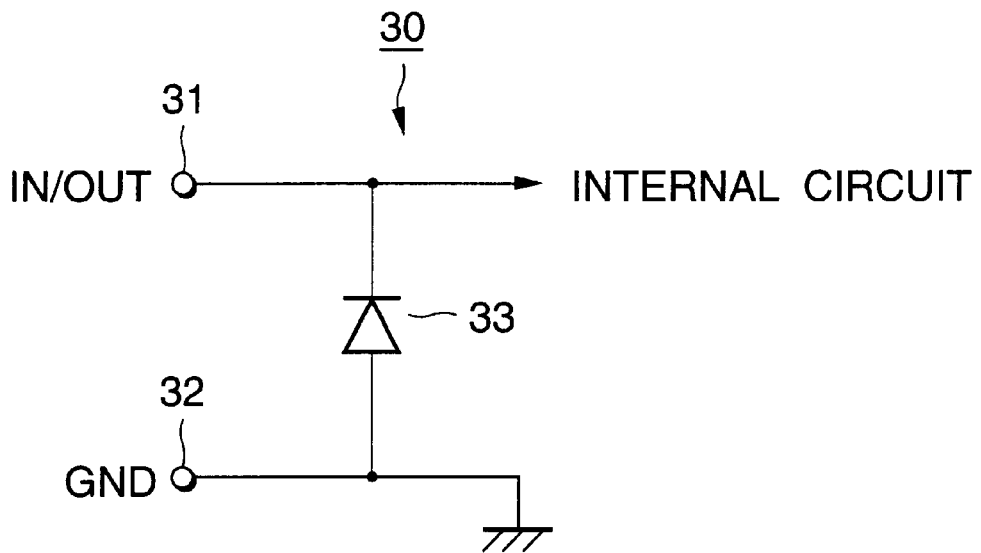
FIG. 7 is an equivalent circuit diagram of a static protection device using a diode in a related art.
Figure 8:
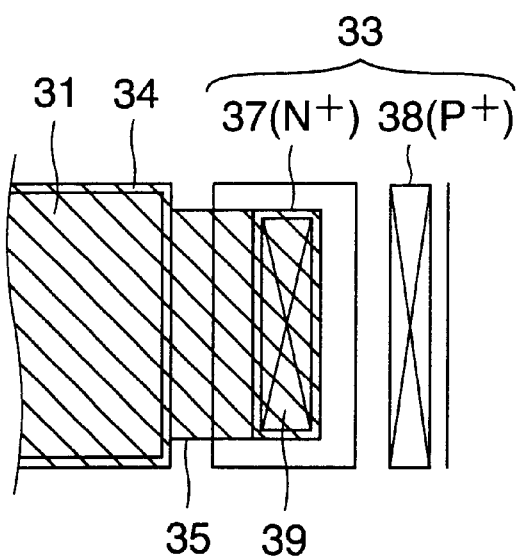
FIG. 8 is a plan view of the static protection device of FIG. 7.
Figure 9:
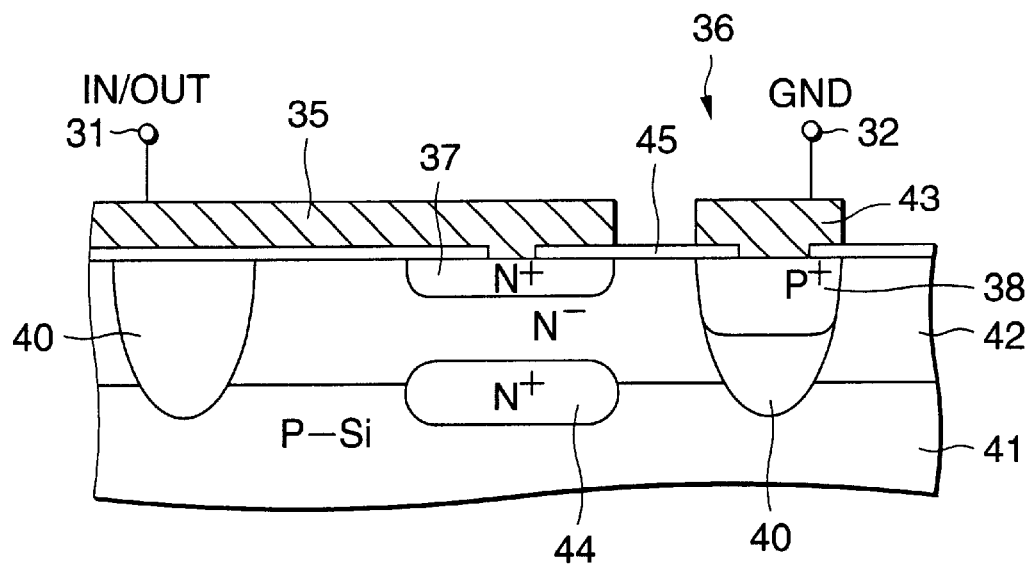
FIG. 9 is a sectional view of the static protection device of FIG. 7.
Figure 10:
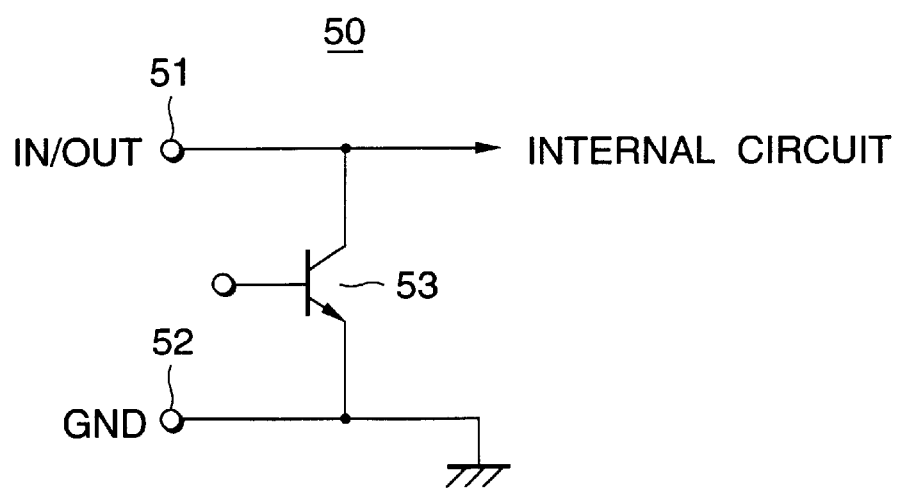
FIG. 10 is an equivalent circuit diagram of a static protection device using an NPN transistor in a related art.
Figure 11:
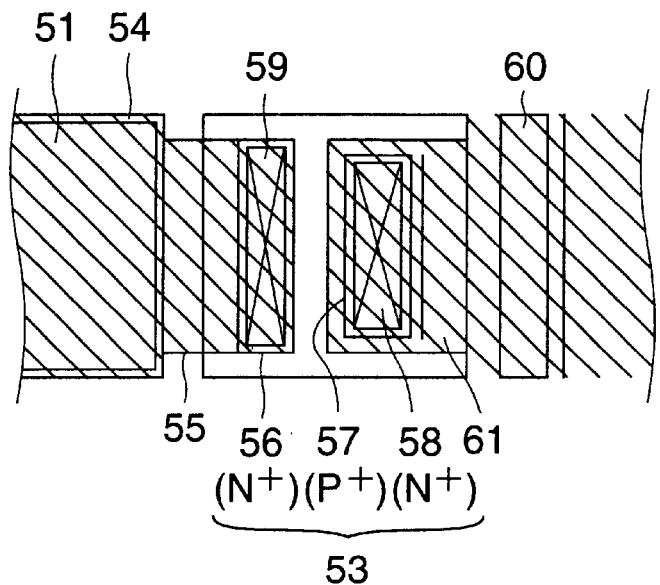
FIG. 11 is a plan view of the static protection device of FIG. 10.
Figure 12:
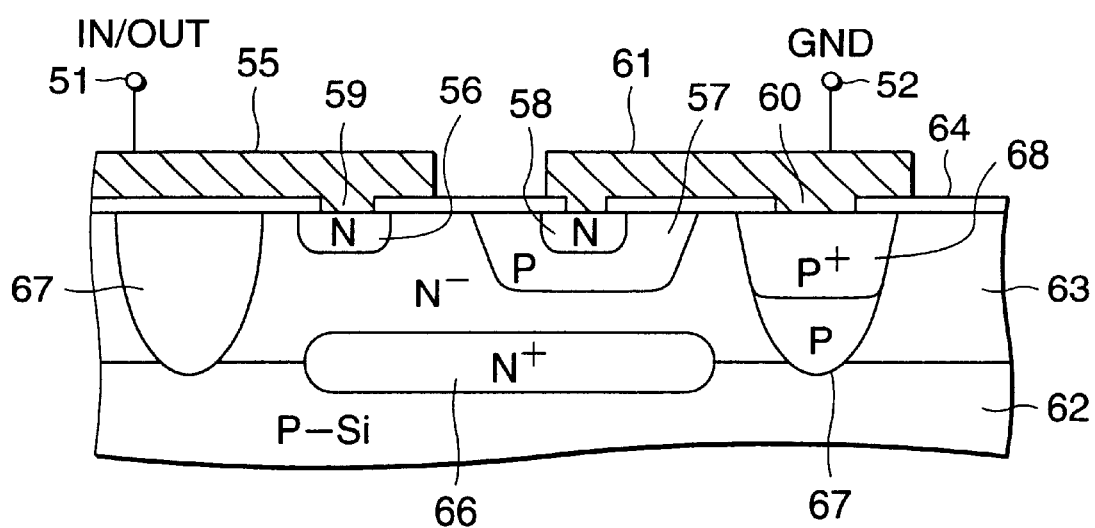
FIG. 12 is a sectional view of the static protection device of FIG. 10.

FIG. 6 shows the cross section of a semiconductor device incorporating the static protection device of the third embodiment. As compared with the sectional view of FIG. 3, it is seen that an N$^+$-type region 16 is formed surrounding a P-type region 7.

According to the configuration discussed with the preferred embodiments, there can be provided a static protection device for preventing an IC operation problem from arising if an input/output terminal falls below GND potential.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A static protection device for an integrated semiconductor device comprising:

an input/output terminal for the integrated semiconductor device;

a ground terminal for the integrated semiconductor device; and a PNP transistor formed in the integrated semiconductor device and connected between the input/output terminal and the ground terminal, wherein the PNP transistor is formed in an N-type conductivity layer on a P-type substrate between first and second isolation regions and comprises a first P-type diffusion region formed in the N-type conductivity layer between the first and second isolation regions and forming an emitter terminal of the PNP) transistor connected to the input/output terminal, and a second P-type diffusion region formed on the second isolation region and contacting the N-type conductivity layer between the first and second isolation regions and forming a collector terminal of the PNP transistor connected to the ground terminal.

2. The static protection device for an integrated semiconductor device as set forth in claim 1, wherein a buried layer having N$^+$-type conductivity is formed below the first P-type diffused region comprising the emitter terminal of the PNP transistor.

3. The integrated semiconductor device as set forth in claim 2, wherein a region having N$^+$-type conductivity is formed in the vicinity of the surface of the semiconductor layer having N-type conductivity so as to surround the first P-type diffused region comprising the emitter terminal of the PNP transistor.

4. The static protection device for an integrated semiconductor device as set forth in claim 1, wherein a region having N$^+$-type conductivity is formed in the vicinity of the surface of the N-type conductivity layer so as to surround the first P-type diffused region comprising the emitter terminal of the PNP transistor.

5. An integrated semiconductor device comprising:

an input/output terminal for an internal circuit of the integrated semiconductor device;

a ground terminal;

a semiconductor substrate having P-type conductivity;

a semiconductor layer having N-type conductivity, which is formed in the vicinity of the surface of the semiconductor substrate;

first and second isolation regions formed laterally in the semiconductor layer and extending to the semiconductor substrate, which provide element separation; and first and second diffused regions having P-type conductivity formed laterally in the vicinity of the surface of the semiconductor layer having N-type conductivity, the first diffused region being formed between said first and second isolation regions and the second diffused region being formed on said second isolation region and contacting the semiconductor layer between the first and second isolation regions;

wherein a PNP transistor is formed in which the first P-type diffused region is used for an emitter terminal connected to the input/output terminal, and the second P-type diffused region is used for a collector terminal connected to the ground terminal, the PNP transistor having a base terminal being left open.

6. The integrated semiconductor device as set forth in claim 5, wherein a buried layer having N+-type conductivity is formed below the first P-type diffused region comprising the emitter terminal of the PNP transistor.

7. The integrated semiconductor device as set forth in claim 6, wherein a region having $N^+$-type conductivity is formed in the vicinity of the surface of the semiconductor layer having N-type conductivity so as to surround the first P-type diffused region comprising the emitter terminal of the PNP transistor.

8. The integrated semiconductor device as set forth in claim 5, wherein a region have $N^+$-type conductivity is formed in the vicinity of the surface of the semiconductor layer having N-type conductivity so as to surround the first P-type diffused region comprising the emmitter terminal of the PNP transistor.

* * * * *